(12) United States Patent
Shreeram et al.

(10) Patent No.: US 10,811,419 B1
(45) Date of Patent: Oct. 20, 2020

(54) STORAGE NODE SHAPING

(71) Applicant: Micron Technology, Inc., Boise, ID (US)

(72) Inventors: Devesh Dadhich Shreeram, Boise, ID (US); Sanket S. Kelkar, Boise, ID (US); Gurpreet S. Lugani, Boise, ID (US); Paul A. Paduano, Boise, ID (US); Matthew N. Rocklein, Boise, ID (US); Sanjeev Sapra, Boise, ID (US); Christopher W. Petz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/419,730

(22) Filed: May 22, 2019

(51) Int. Cl.
  *H01L 27/108* (2006.01)
  *H01L 49/02* (2006.01)
(52) U.S. Cl.
  CPC .... *H01L 27/1087* (2013.01); *H01L 27/10829* (2013.01); *H01L 28/92* (2013.01)

(58) Field of Classification Search
  CPC .......... H01L 27/1087; H01L 27/10829; H01L 27/10852
  See application file for complete search history.

(56) References Cited

U.S. PATENT DOCUMENTS

| | | | |
|---|---|---|---|
| 7,662,693 B2 | 2/2010 | Bhattacharyya | |
| 7,875,529 B2 | 1/2011 | Forbes et al. | |
| 8,274,777 B2 | 9/2012 | Kiehlbauch | |
| 8,748,283 B2 * | 6/2014 | Huang | ...................... H01G 4/20 257/E29.343 |

* cited by examiner

*Primary Examiner* — Matthew L Reames
(74) *Attorney, Agent, or Firm* — Brooks, Cameron & Huebsch, PLLC

(57) ABSTRACT

Methods, apparatuses, and systems related to shaping a storage node material are described. An example method includes forming a pillar with a pattern of materials. The method further includes depositing a storage node material on a side of the pillar. The method further includes etching sacrificial materials within the pillar. The method further includes etching the storage node material in a direction from the pillar into the storage node.

20 Claims, 10 Drawing Sheets

STORAGE NODE SHAPING

TECHNICAL FIELD

The present disclosure relates generally to semiconductor devices and methods, and more particularly to shaping a storage node.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1:
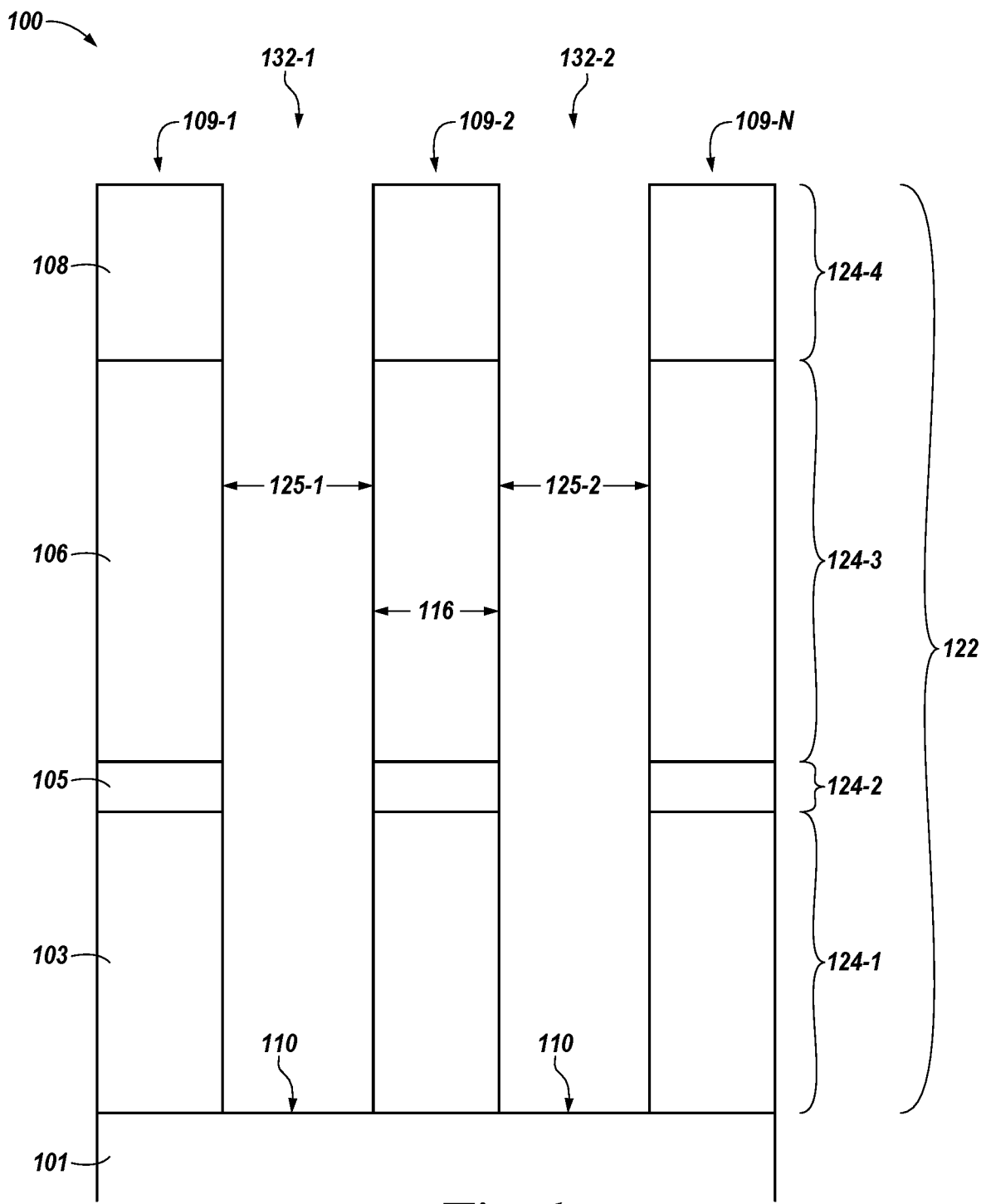
FIGS. 1-7 illustrate cross-sectional views of a portion of a semiconductor structure of a memory device in association with a semiconductor fabrication sequence for shaping of a storage node in accordance with a number of examples of the present disclosure.

Various types of semiconductor structures on memory devices (e.g., those that include volatile or non-volatile memory cells) may include rectilinear trenches and/or round, square, oblong, etc., cavities that may be formed into semiconductor material to create openings thereon for subsequent semiconductor processing steps. Various materials may be deposited using chemical vapor deposition (CVD), plasma deposition, etc. and patterned using photolithographic techniques, doped and etched using vapor, wet and/or dry etch processes to form semiconductor structures on a substrate. Such openings may contain, or be associated with, various materials that contribute to data access, storage, and/or processing, or to various support structures, on the memory device. As an example, capacitor material may be deposited into these openings to provide the data access, storage, and/or processing.

In order to increase the capacitance of a cell of the memory device, a surface area of a semiconductor substrate formed into a column can be increased by increasing the height of the capacitor material column within the openings. However, as capacitor columns increase in height with pillars having higher aspect ratios, it may be difficult to increase the pitch/space between capacitors without the structure tapering. Subsequent etches to straighten the capacitor column may result in a loss of pillar materials including oxides (TEOS and BPSG).

In order to mitigate this issue, a method for shaping of a storage node is described further below. As an example, a storage node material may be deposited on the sides or within an opening of a support pillar formed with a pattern of materials. The storage node material may be etched in a direction away from the support pillar and toward the opening for the storage node material, increasing the space between adjacent capacitor material that may be deposited within the openings between the support pillars.

The present disclosure includes methods, apparatuses, and systems related to shaping of a storage node material, resulting in a change in capacitor diameter and therefore a larger width between capacitors in high aspect ratio pillars. In this way, issues including dielectric shorts in adjacent cells, pinch-off, and so forth, due to a width between capacitors being too small can be avoided. An example of a method described herein includes forming a pillar with a pattern of materials. The pillar may include oxide materials in between nitride lattices. The example method may further include depositing a storage node material on a side of the pillar and/or filling an opening created by etching through the pattern of materials. The example method may further include etching sacrificial materials within the pillar. The example method may further include etching the storage node material in a direction from the pillar into the storage node.

In the following detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure. As used herein, "a number of" something can refer to one or more such things. For example, a number of capacitors can refer to at least one capacitor.

The figures herein follow a numbering convention in which the first digit or digits correspond to the figure number of the drawing and the remaining digits identify an element or component in the drawing. Similar elements or components between different figures may be identified by the use of similar digits. For example, reference numeral 108 may reference element "08" in FIG. 1, and a similar element may be referenced as 208 in FIG. 2. In some instances, a plurality of similar, but functionally and/or structurally distinguishable, elements or components in the same figure or in different figures may be referenced sequentially with the same element number (e.g., 124-1, 124-2, 124-3, 124-4 in FIG. 1).

FIG. 1 illustrates a cross-sectional view 100 of a portion of an example semiconductor structure of a memory device in association with a semiconductor fabrication sequence for shaping of a storage node in accordance with a number of examples of the present disclosure. The example semiconductor structure can include a plurality of pillars 109-1, 109-2, . . . , 109-N (hereinafter referred to collectively as plurality of pillars 109). Each of the plurality of pillars 109 may include a first silicate material 103, shown to have been formed over an underlying substrate material 101. The substrate material 101 may be formed from various undoped or doped materials on which memory device materials may be fabricated. Examples of a relatively inert undoped substrate material 101 may include monocrystalline silicon (monosilicon), polycrystalline silicon (polysilicon), and amorphous silicon, among other possibilities.

The first silicate material 103 may, in a number of examples, have been formed from borophosphosilicate glass (BPSG). The BPSG may include a silicon compound doped with various concentrations and/or ratios of a boron compound and a phosphorus compound. The silicon compound may be silicon dioxide ($SiO_2$), which may be formed by oxidation of silane ($SiH_4$), among other possibilities. The boron compound may be diboron trioxide ($B_2O_3$), which may be formed by oxidation of diborane ($B_2H_6$), among other possibilities. The phosphorus compound may be diphosphorus pentoxide ($P_2O_5$), which may be formed by oxidation of phosphine ($PH_3$), among other possibilities. The silicon, boron, and phosphorus compounds of the BPSG may include various isotopes of silicon, boron, and phosphorus, as determined to be appropriate for functionality, formation, and/or removal of the first silicate material 103, as described herein.

The first silicate material 103 may be originally formed (e.g., deposited) over a surface 110 of the underlying substrate material 101. For example, the first silicate material 103 may be formed without an opening formed therein from an upper surface of the first silicate material 103 to the surface 110 of the underlying substrate material 101. The first silicate material 103 may, in a number of examples, be deposited to a thickness in a range of approximately 200 nanometers (nm) to approximately 1000 nm above the surface 110 of the underlying substrate material 101. However, embodiments of the present disclosure are not limited to this example.

A first nitride material 105 may be formed over a surface of the first silicate material 103 opposite from the underlying substrate material 101. The first nitride material 105 may be formed (e.g., deposited) over an upper surface of the first silicate material 103. The first nitride material 105 may be formed from a nitride material selected for dielectric properties. For example, one or more dielectric nitrides may be selected from silicon nitride ($SiN_x$, $Si_3N_4$), aluminum nitride (AlN), gallium nitride (GN), tantalum nitride (TaN, $Ta_2N$), titanium nitride (TiN, $Ti_2N$), and tungsten nitride (WN, $W_2N$, $WN_2$), among other possibilities, for formation of the first nitride material 105. The first nitride material 105 may, in a number of examples, be deposited to a thickness in a range of approximately 10 nm to approximately 100 nm above the surface of the first silicate material 103.

A second silicate material 106 is shown to have been formed over a surface of the first nitride material 105 opposite from the first silicate material 103. The second silicate material 106 may, in a number of examples, be formed from tetraethyl orthosilicate ($Si(OC_2H_5)_4$), which is also referred to as TEOS. TEOS may be formed as an ethyl ester of orthosilicic acid ($Si(OH)_4$), among other possibilities. The second silicate material 106 may, in a number of examples, be deposited to a thickness in a range of approximately 200 nm to 600 nm above the surface of the first nitride material 105.

A second nitride material 108 is shown to have been formed over a surface of the second silicate material 106 opposite from the first nitride material 105. The second nitride material 108 may be formed (e.g., deposited) over an upper surface of the second silicate material 106.

Similar to the first nitride material 105, the second nitride material 108 may be formed from a nitride material selected for dielectric properties. That is, the second nitride material 108 may be formed from the same material as the first nitride material 105. The second nitride material 108 may, in a number of examples, be deposited to a thickness in a range of from approximately 10 nm to approximately 150 nm above the surface of the second silicate material 106.

In at least one example, the width or diameter 125-1, 125-2 of the respective openings 132-1, 132-2 (hereinafter referred to collectively as openings 132) between plurality of pillars 109-1 and 109-2 may be within a range of approximately 200-600 Angstroms (or 20 to 60 nm) and the height of the openings 132 may be within a range of approximately 8,000-15,000 Angstroms (800-1,500 nm) and may result in an aspect ratio (AR) of the height to width being in a range of approximately 25:1 to approximately 50:1. For clarity in the example fabrication sequence, the figures show a first opening 132-1 and a second opening 132-2 but examples are not limited to two openings and may include various numbers of openings. The width of the plurality of pillars 109 may be a width 116.

As the height 122 of the plurality of pillars 109-1 to 109-N increases, it may be difficult to increase the pitch (the space between the capacitor materials) without causing the openings 132 to taper. In order to reduce the storage node, thereby increasing capacitor pitch, the plurality of pillars 109 may be formed using a pattern of materials. The plurality of pillars 109 may, in a number of examples, be formed by patterning (e.g., depositing) a first silicate material 103, a first nitride material 105, a first silicate material 106, and a second nitride material 108. The first and second nitride materials 105, 108 may form the support structure by extending between and connecting (e.g., attaching) to features associated with multiple capacitors (e.g., as shown and described in connection with FIGS. 4-5) or other structural elements of the example semiconductor structure. A support structure formed as such may enable a stack of the first and the second silicate materials 103, 106 to be maintained in a more static configuration relative to each other and the underlying substrate material 101 than provided by the first and the second silicate materials 103, 106 themselves.

An etch process (e.g., a first wet etch process or dry etch process) may be utilized to etch into (e.g., through) the second nitride material 108, the second silicate material 106, the first nitride material 105, and/or the first silicate material 103 to form the opening within the previously listed materials (as is illustrated already as opening 132-1 between the plurality of pillars 109-1 and 109-2). Performance of the etch process may allow for a formation of an opening (within which a column of silicon fill material can be deposited) that extends from the upper surface of the second nitride material 108 to the surface 110 of the substrate material 101.

The resultant openings 132 may have a height 122 in a range of from approximately 8,000 Angstroms (or 800 nm) to approximately 15,000 Angstroms (or 1,500 nm). Each of the materials may contribute a particular height to the overall height 122 of the structure. As is illustrated in FIG.

1, the first silicate material 103 can have a height 124-1, the first nitride material 105 can have a height 124-2, the second silicate material 106 can have a height 124-3, and the second nitride material 108 can have a height 124-4, that, when added together, results in the overall height 122.

In some examples, the height 124-1 of the first silicate material 103 can be one of approximately 2000 Angstroms, approximately 2400 Angstroms, approximately 3600 Angstroms, approximately 4000 Angstroms, approximately 4200 Angstroms, approximately 4500 Angstroms, approximately 4900 Angstroms, approximately 5300 Angstroms, approximately 5700 Angstroms, and/or within a range from approximately 2000 Angstroms to approximately 10000 Angstroms. In some examples, the height 124-2 of the first nitride material 105 can be one of approximately 100 Angstroms, approximately 400 Angstroms, approximately 700 Angstroms, and/or within a range from approximately 100 to approximately 1000 Angstroms. In some examples, the height 124-3 of the second silicate material 108 can be one of approximately 2000 Angstroms, approximately 3500 Angstroms, approximately 4700 Angstroms, and/or within a range from approximately 2000 to 6000 Angstroms. In some examples, the height 124-4 of the second nitride material 108 can be one of approximately 500 Angstroms, approximately 750 Angstroms, approximately 970 Angstroms, approximately 1200 Angstroms, and/or within a range from approximately 500 to approximately 1500 Angstroms. However, embodiments of the present disclosure are not limited to this example.

Figure 2:
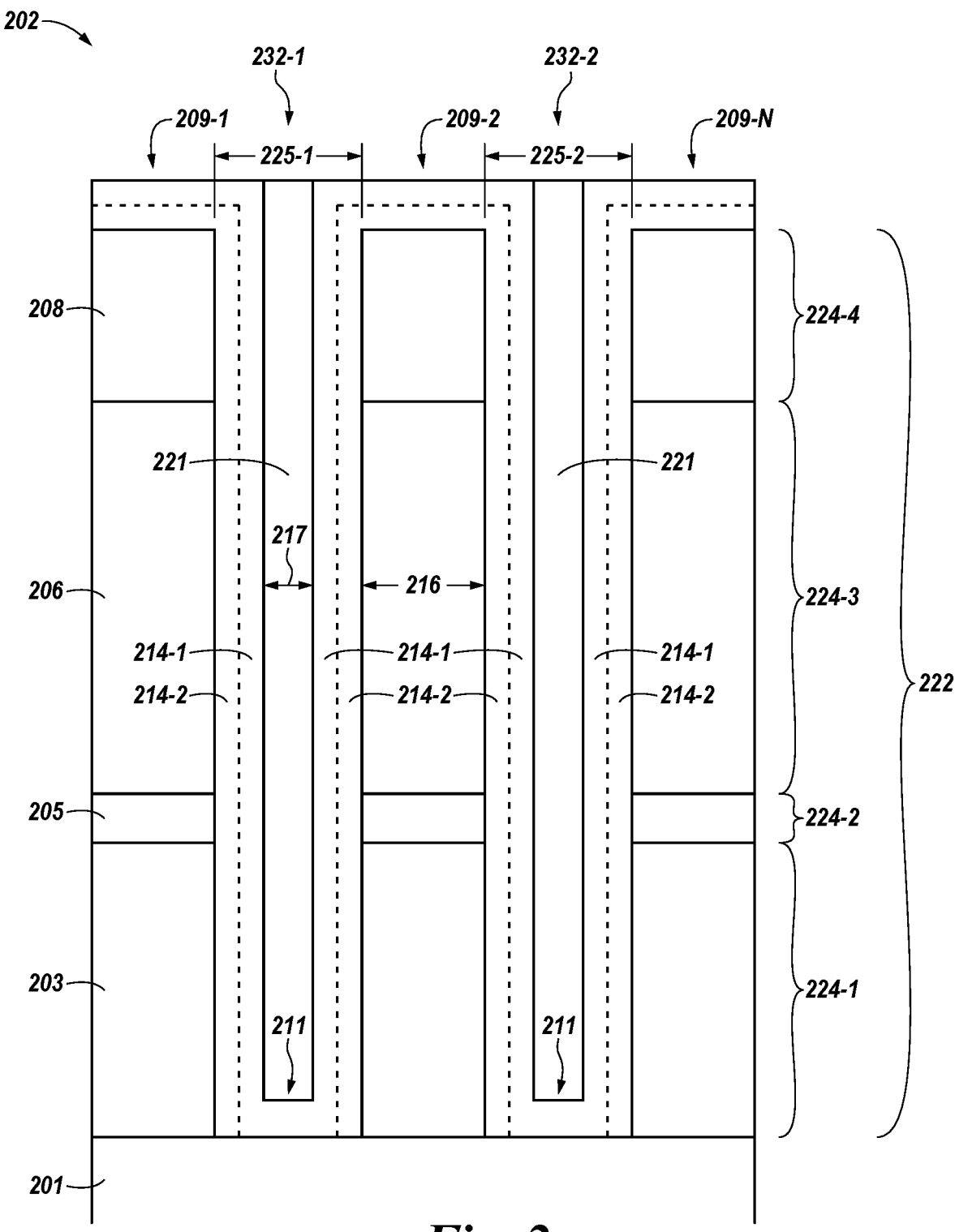

FIG. 2 illustrates a cross-sectional view 202 of a portion of an example semiconductor structure of a memory device in association with a semiconductor fabrication sequence for shaping of a storage node in accordance with a number of examples of the present disclosure. FIG. 2 illustrates the example semiconductor structure at the particular stage following completion of the example fabrication sequence described in connection with FIG. 1.

The cross-sectional view 202 can include the same or similar elements as the example cross-sectional view 100 as referenced in FIG. 1. For example, the substrate material 201 is analogous or similar to substrate material 101. First silicate material 203 is analogous or similar to first silicate material 103, first nitride material 205 is analogous or similar to first nitride material 105, second silicate material 206 is analogous or similar to second silicate material 106, and second nitride material 208 is analogous or similar to second nitride material 108. As the height 222 of the plurality of pillars 209 increases, a bending and/or leaning of the plurality of pillars 209 may occur. The materials within the plurality of pillars 209 (the second nitride material 208, the second silicate material 206, the first nitride material 205, and/or the first silicate material 203) may be deposited in a manner that causes a tapering of the openings 232. The tapering may be removed using a wet etch process. The removal of the tapering may result in straighter plurality of pillars 209.

After the completion of the formation of the plurality of pillars 209, storage node materials 214-1, 214-2 (hereinafter referred to collectively as 214) may be deposited on the sides of the plurality of pillars 209. In one example, the storage node materials 214-1 and 214-2 can each be a separate layer of storage node material and/or may be composed of different material. The first storage node material 214-1 may be formed from a nitride material. In one example, the nitride material may be a titanium nitride (TiN) material. The first storage node material 214-1 may be positioned on the outside of the storage node 214. The second storage node material 214-2 may include a plurality of dopants. To control the etch rate of the TiN, the second storage node material 214-2 may be doped with silicon (TiSiN). The second storage node material 214-2 may be positioned on the inside of the storage node 214. The second storage node material 214-2 material may be placed to selectively target which areas of the plurality of pillars 209 will be etched. A high silicon range of between 10% and 40% silicon may assist in reducing the diameter of the openings 232.

The width of the openings 232-1, 232-2 (hereinafter referred to collectively as 232) that the storage node material 214 is deposited within can be widths 225-1, 225-2 (hereinafter referred to collectively as 225), respectively. The storage node material 214 may be deposited along the plurality of pillars 209 for the entire height 222 or a substantial portion of the height 222 of the plurality of pillars 209. The storage node 214 may be deposited on the sides of the plurality of pillars 209 while leaving a width 217 for the openings 232. The storage node material 214 may store charge after the capacitor material and the dielectric (as described in FIGS. 4 and 5) have been deposited on the sides of the openings 232. The storage node material 214 may be a sacrificial liner formed out of a high etch rate bottom electrode.

In one example, the second storage node material 214-2 may be a boron-doped titanium nitride (TiBN) material, a silicon-doped titanium nitride (TiSiN) material, an aluminum-doped titanium nitride (TiAlN) material, a carbon-doped titanium nitride (TiCN) material, a tungsten-doped titanium nitride (TiWN) material among other possibilities. In another example, the second storage node material 214-2 may also be doped with an oxide material. The oxide material may be a ruthenium oxide (RuO) material or an Iridium oxide (IrO) material, among other possibilities.

The high silicon concentration of the second storage node material 214-2 may aid in reducing the space within the openings. The openings 232 may be reduced by a range of approximately 2-40 angstroms. A reduction of the openings 232 may result in an increase in pillar width 216. During the deposition of the storage node material 214, the plurality of pillars 209 may have a width 216. That is, the plurality of pillars 209 may have a width 216 after the plurality of pillars 209 have been formed, taperings are etched, and the storage node material 214 has been deposited on the sides of the plurality of pillars 209. The width of the plurality of pillars 209 may range from approximately 10 nm to 20 nm.

As is illustrated in FIG. 2, a silicon fill material 221 is shown as having been formed (e.g., deposited) to fill the openings 232 from the substrate material 201 to a height 222 of the openings 232 at the upper surface of the second nitride material 208. The silicon fill material 221 may fill the openings 232 such that no air gaps may be within the openings 232. The silicon fill material 221 may be formed from dielectric materials. The silicon fill material may be formed from nitride doped silicon (SiN), among other possibilities. In a number of embodiments, the silicon fill material silicon fill material 221 may be deposited to fill the openings 211-1, 211-2 to an upper surface of the first electrode material 236. The silicon fill material 221 may be formed from any conductive material to fill the width 217.

Figure 3:
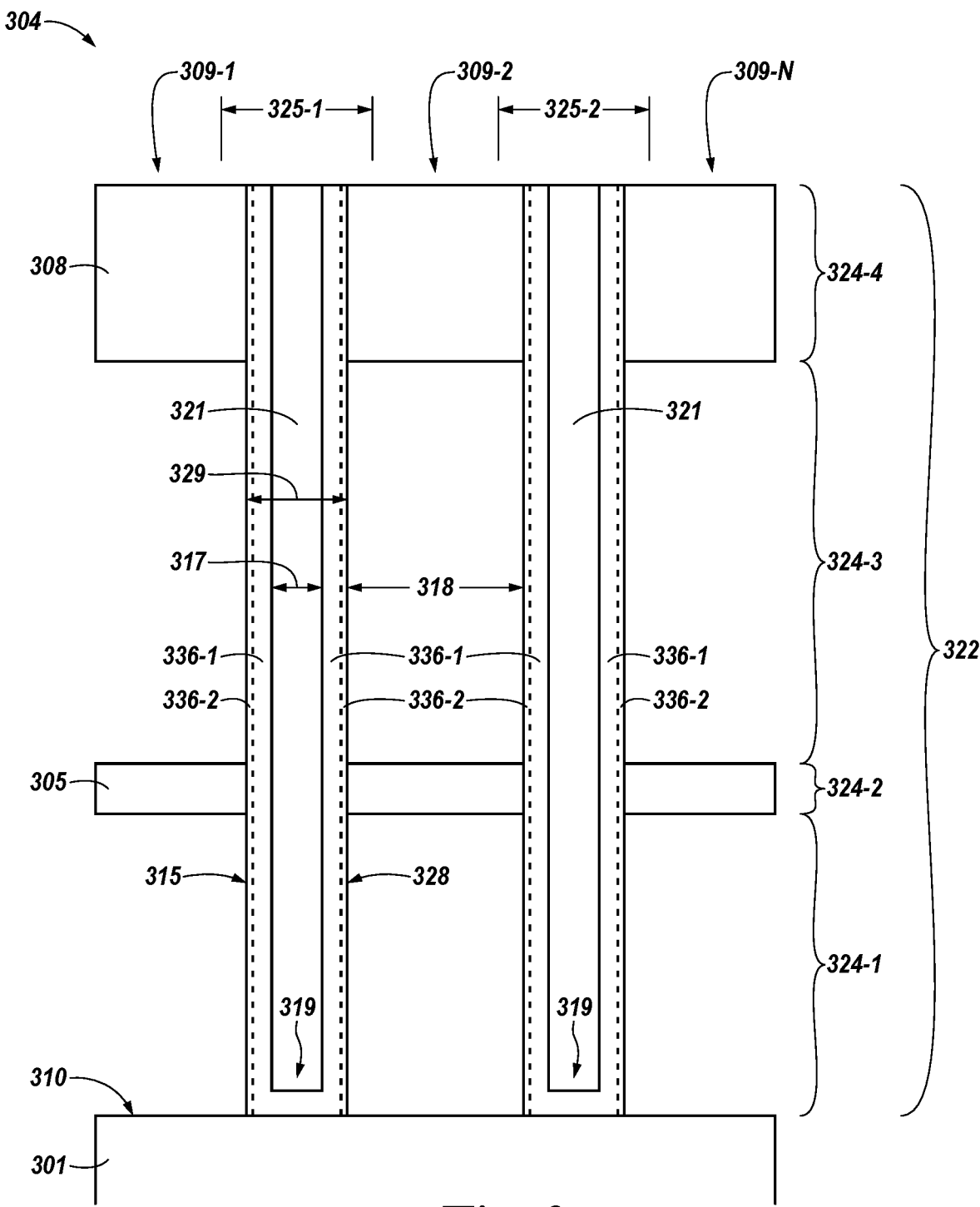

FIG. 3 illustrates a cross-sectional view 304 of a portion of an example semiconductor structure of a memory device in association with a semiconductor fabrication sequence for shaping of a storage node in accordance with a number of examples of the present disclosure. FIG. 3 illustrates the example semiconductor structure at the particular stage following completion of the example fabrication sequence described in connection with FIG. 2.

The cross-sectional view 304 can include the same or similar elements as the example cross-sectional views 100 and 202 as referenced in FIGS. 1 and 2, respectively. For example, the substrate material 301 is analogous or similar to substrate material 101 and 201 of FIGS. 1 and 2, respectively. The first nitride material 305 is analogous or similar to first nitride material 105 and 205 of FIGS. 1 and 2, respectively. The second nitride material 308 is analogous or similar to second nitride material 108 and 208 of FIGS. 1 and 2, respectively. The silicon fill material 321 is analogous or similar to silicon fill material 221.

In one example, the storage node (for example storage node 214) above the plurality of pillars 309 may be planarized using the chemical mechanical polishing (CMP). The CMP process may be performed to planarize the storage node material 336 to the level of the top surfaces of the plurality of pillars 309.

In this example, the first silicate material shown at 103 and 203 in FIGS. 1 and 2, respectively, and the second silicate material shown at 106 and 206 in FIGS. 1 and 2, respectively, have been etched and recessed from the plurality of pillars 309. The first and second silicate materials may be removed with (via application of) a solvent that is selective for removing (e.g., dissolving) the first and second silicate materials from the plurality of pillars 309 while not removing (e.g., leaving) other materials such that the nitride lattice materials remain on the plurality of pillars 309. Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), Hydrofluoric acid (HF), Phosphoric Acid ($H_3PO_4$), Hydrochloric Acid (HCl), Ammonium Hydroxide ($NH_4OH$), and combinations thereof, among other possibilities. Removal of the first and second silicate materials may leave empty spaces (e.g., voids) in the semiconductor structure during the fabrication process.

In addition, the first nitride material 305 and the second nitride material 308 may be left remaining following the application of the selective solvent, among other possible components or structural features that may remain in the semiconductor structure. The remaining first nitride material 305 and the remaining second nitride material 308 may function as a capacitor support structure, to provide support in view of the empty spaces in the semiconductor structure during the fabrication process.

Following the etching and recessing of the materials (the first and second silicate materials) within the plurality of pillars 309, the storage node material (shown as 214 in FIG. 2) may be etched from within the plurality of pillars 309. That is, the second storage node material 336-2 may be etched to create space within the openings. The bottom electrode may include the first storage node material 336-1 and the second node material (e.g., a sacrificial liner of the bottom electrode). The second storage node material 336-2 may be etched in a direction 315 and 328 from a pillar (such as pillar 309-1) towards an opening (such as opening 232-1 in FIG. 2, not numbered for ease of illustration). The width 317 of the openings remains the same while the second storage node material (such as second storage node material 214-2 in FIG. 2) is etched from within the plurality of pillars 309 to result in a thinner second storage node material 336-2, as illustrated in FIG. 3, while creating a wider plurality of pillars 309. That is, a width 329 of the storage node material 336 may be thinner than the width 325 of storage node material 336 before it was etched. As the inner material 336-2 of the storage node is etched, it leaves the storage node material 336 to consist mainly of the outer material 336-1.

In another example, the storage node material 336 may be etched from the openings towards the plurality of pillars 309. In another example, the storage node material 336 may be etched in a direction from both of the openings towards the plurality of pillars 309. That is, the storage node material 336 may be etched from the openings towards the plurality of pillars 309 while also being etched from within the plurality of pillars 309 towards the openings, resulting in a thinning of the storage node material 336 from both sides.

The width 318 of the plurality of pillars 309 may range from approximately 10 nm to 20 nm. That is, the plurality of pillars 309 may have a width increase ranging from 0.2 nm to 5 nm after the storage node material 336 has been etched. The increase of width 318 of the plurality of pillars 309 may cause the openings to decrease in diameter.

The storage node material 336 may be etched using a dilution containing hydrofluoride. In one example, the storage node material 336 etch may occur during the wet etch removal of the tapering of the openings. In another example, the storage node material 336 etch may occur during the wet or dry etch removal of the first and second silicate materials. In another example, the storage node material 336 etch may occur after the removal of the first and second silicate materials. The etch rate of the hydrofluoric acid dilution is determined by the silicon concentration of the TiSiN of the storage node material 336. That is, the silicon concentration within the storage node material 336 determines the etch rate and how fast the hydrofluoric acid dilution will etch the storage node material 336.

Figure 4:
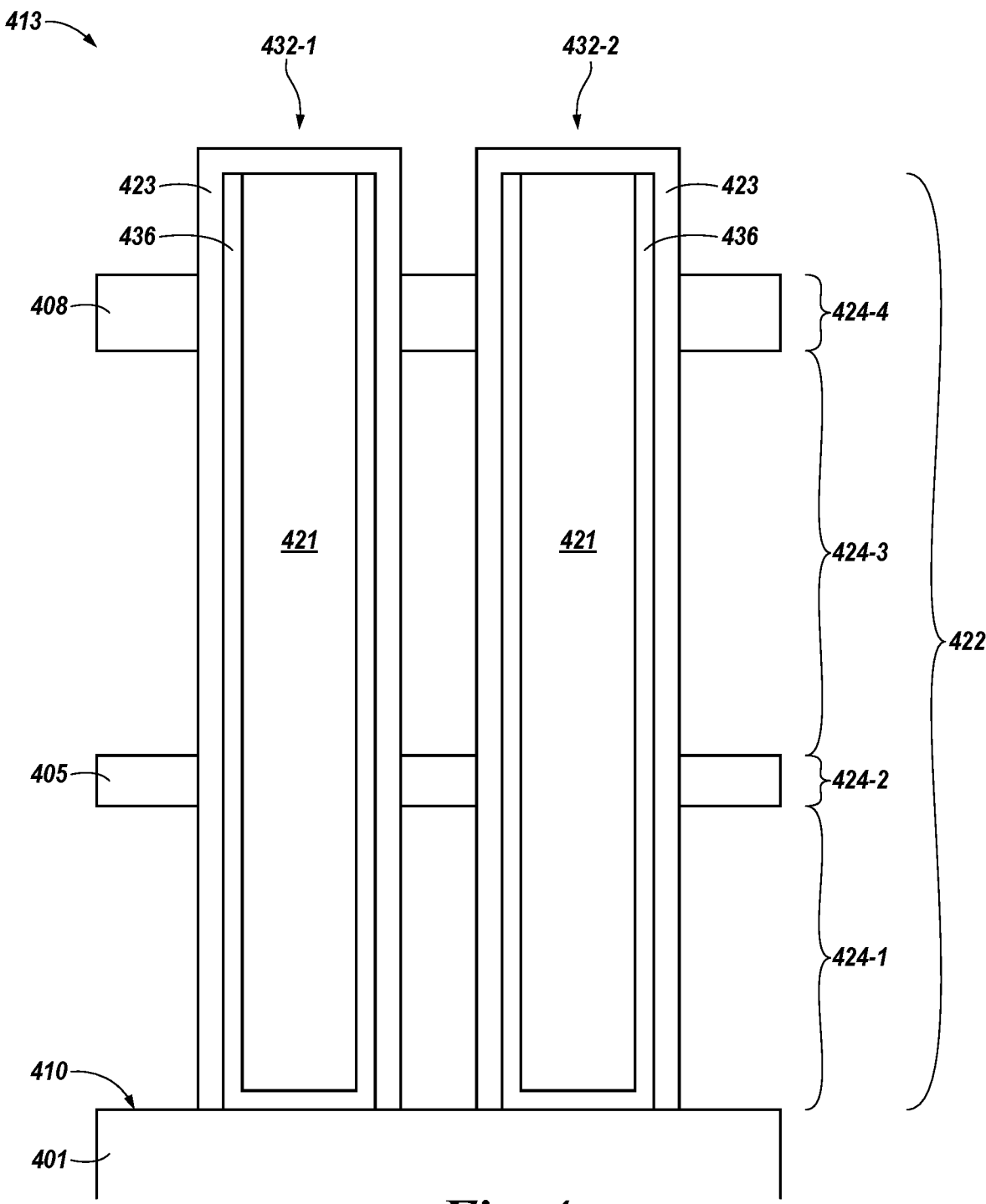

FIG. 4 illustrates a cross-sectional view 435 of a portion of an example semiconductor structure of a memory device in association with a semiconductor fabrication sequence for shaping of a storage node in accordance with a number of examples of the present disclosure. FIG. 4 illustrates the example semiconductor structure following completion of the example fabrication sequence described in connection with FIG. 3.

The cross-sectional view 413 can include the same or similar elements as the example cross-sectional views 100, 202, and 304 as referenced in FIGS. 1, 2, and 3, respectively. For example, the substrate material 401 is analogous or similar to substrate material 101, 201, and 301 of FIGS. 1, 2, and 3, respectively. The first nitride material 405 is analogous or similar to first nitride material 105, 205, and 305 of FIGS. 1, 2, and 3, respectively. The second nitride material 408 is analogous or similar to second nitride material 108, 208, and 308 of FIGS. 1, 2, and 3, respectively. The silicon fill material 421 is analogous or similar to silicon fill material 221 and 321 of FIGS. 2 and 3, respectively.

As shown, a first electrode material 436 may be formed (e.g., deposited) on the surface 410 of the substrate material 401 and on the sidewalls of the openings 432. As is illustrated in FIG. 4, a silicon fill material 421 is shown as having been formed (e.g., deposited) to fill the openings 432 from the substrate material 401 to a height 422 of the openings 432 at the upper surface of the plurality of pillars 409. An opening 432 between materials 409-1 and 409-2 may extend from the substrate material 401 to the height 422 of the openings 432 at the upper surface of the plurality of pillars 409.

In a number of examples, the silicon fill material 421 may be deposited to fill the openings 432 to an upper surface of the first electrode material 436. The first electrode material 436 and the silicon fill material 421 may be formed from conductive materials and to various widths (e.g., thicknesses) as suited to a particular design rule for the formation of an operable capacitor for a semiconductor device.

The first electrode 436 may be formed (e.g., deposited) on upper surfaces of remaining portions of the silicon fill material 421, such that the silicon fill material 421 is covered on all surfaces with the first electrode material 436. That is, a height 422 of the silicon fill material 421 is covered by the first electrode material 436. As an example, the height 422 of the silicon fill material 421 spans the height 424-1 of the removed first silicate material, the height 424-2 of the first nitride material 405, the height 424-3 of the removed second silicate material, and the height 424-4 of the second nitride material 408, that, when added together, results in the overall height 422.

In a number of examples, the silicon fill material 421 may be deposited to fill the openings 432 to an upper surface of the first electrode material 436. The first electrode material 436 and the silicon fill material 421 may be formed from conductive materials and to various widths (e.g., thicknesses) as suited to a particular design rule for the formation of an operable silicon fill material within a semiconductor device.

As shown, a dielectric material 423 has been formed (e.g., deposited) on an outer surface of the first electrode material 436. The dielectric material 423 may, in a number of examples, be formed from a surface 410 of the substrate material 401 to cover the outer surface, including an upper surface, of the first electrode material 436.

Figure 5:
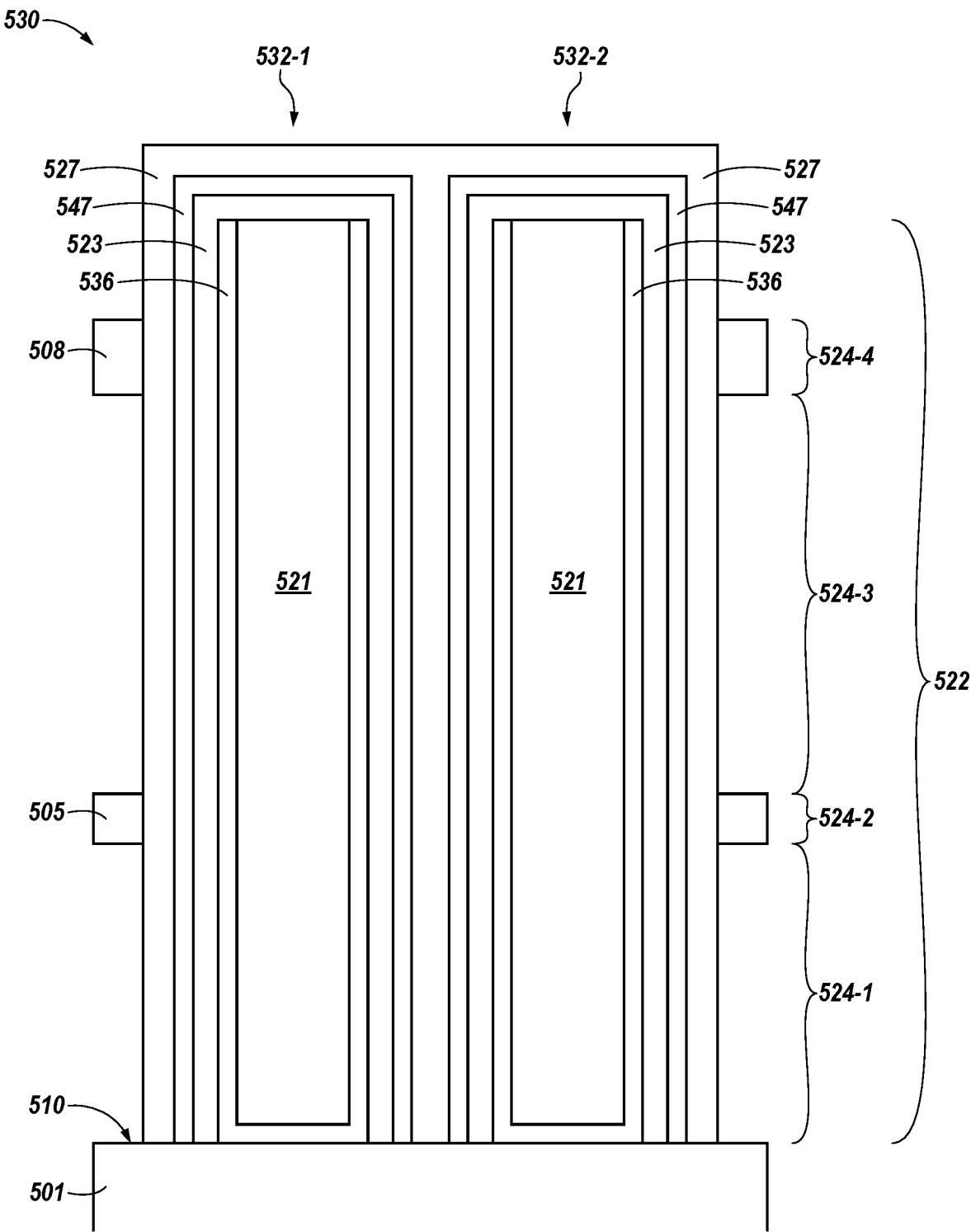

FIG. 5 illustrates a cross-sectional view 530 of a portion of an example semiconductor structure of a memory device in association with a semiconductor fabrication sequence for shaping of a storage node in accordance with a number of examples of the present disclosure. FIG. 5 illustrates the example semiconductor structure following completion of the example fabrication sequence described in connection with FIG. 4.

The cross-sectional view 530 can include the same or similar elements as the example cross-sectional views 100, 202, 304, and 413 as referenced in FIGS. 1, 2, 3, and 4 respectively. For example, the substrate material 501 is analogous or similar to substrate material 101, 201, 301, and 401 of FIGS. 1, 2, 3, and 4 respectively. The first nitride material 505 is analogous or similar to first nitride material 105, 205, 305, and 405 of FIGS. 1, 2, 3, and 4 respectively. The second nitride material 508 is analogous or similar to second nitride material 108, 208, 308, and 408 of FIGS. 1, 2, 3, and 4 respectively. The silicon fill material 521 is analogous or similar to silicon fill material 221, 321, and 421 of FIGS. 2, 3, and 4 respectively.

As shown, the dielectric material 523 has been formed (e.g., deposited) on an outer surface of the first electrode material 536. The dielectric material 523 may, in a number of examples, be formed from a surface 510 of the substrate material 501 to cover the outer surface, including an upper surface, of the first electrode material 536. A silicon fill material 521 may be subsequently formed, at least in part, by formation (e.g., deposition) of a second electrode material 547 on an outer surface of the dielectric material 523.

As is illustrated in FIG. 5, a height 522 of the silicon fill material 521 can include a height 524-2 and 524-4 of the first nitride material 505 and the second nitride material 508 along with heights 524-1, and 524-3 of the removed first silicate material, and the second silicate material, respectively as illustrated in FIG. 1.

The portion of the example semiconductor structure of a memory device illustrated in FIG. 5 shows a first and a second silicon fill material silicon fill material 521 indicated as widths in the structure and formed as just described. A height 522 of the silicon fill materials 521 may be higher than the height of the original opening due to the dielectric material 523 and second electrode material 547 being formed over the first electrode material 536. The example semiconductor structure illustrated in FIG. 5 shows a buffer material 527 that may be formed around and between the first and second silicon fill materials 521 as a conductive material between cells. The dielectric material 523, the second electrode material 547, and the buffer material 527 may be formed from various respective dielectric materials, conductive materials, and resistive materials and to various width (e.g., thickness) usable in association with formation of an operable silicon fill material for a semiconductor device.

The support structure is formed from the first nitride material 505 and the second nitride material 512, in addition to the underlying substrate material 501. The support structure may provide support to the first and second silicon fill materials 521 after the removal of the first and second silicate materials has left voids in the semiconductor structure and even after such voids may have been at least partially filled by the buffer material 527. The support structure formed from the first and second nitride materials 505, 512 is shown for ease of illustration in what can be a 3D-cross sectional view to be supporting behind the silicon fill material 521 and the right side of the first electrode material 536 for the other silicon fill material 521. However, the support structure formed from the first and second nitride materials 505, 512 also may be on the opposite sides, or may be attached at four position or even surround, the first and second silicon fill materials 521. In a number of examples, the dielectric material 523, the second electrode material 547, and/or the buffer material 527 may surround the first electrode material 536 of the silicon fill materials 521 except at defined positions where the first and second nitride materials 505, 512 of the support structures are attached to the first electrode material 536.

Formation of the capacitors and a capacitor support structure as just described may enable each of the capacitors to be maintained in a static configuration (e.g., relative to each other and the underlying material). For example, the capacitor support structure may reduce (e.g., prevent) a possibility of a capacitor bending and/or twisting during fabrication or use. By including a sacrificial storage node, as described herein, the width for openings 532 may be widened, increasing the space for the capacitor 521 to be filled. The capacitor 521 may be filled into the openings 532, leaving space for another capacitor material to be filled without the two capacitor materials touching. That is, the widening of the openings 532

Formation of the capacitors and capacitor support structure as just described may be utilized in fabrication of a memory device that includes at least one memory cell. Such a memory cell may include at least one such capacitor, as a data storage element, that is supported by the capacitor support structure. The memory cell also may include at least one access device (e.g., transistor) (not shown) that is, or may be, coupled to the at least one capacitor.

Figure 6:
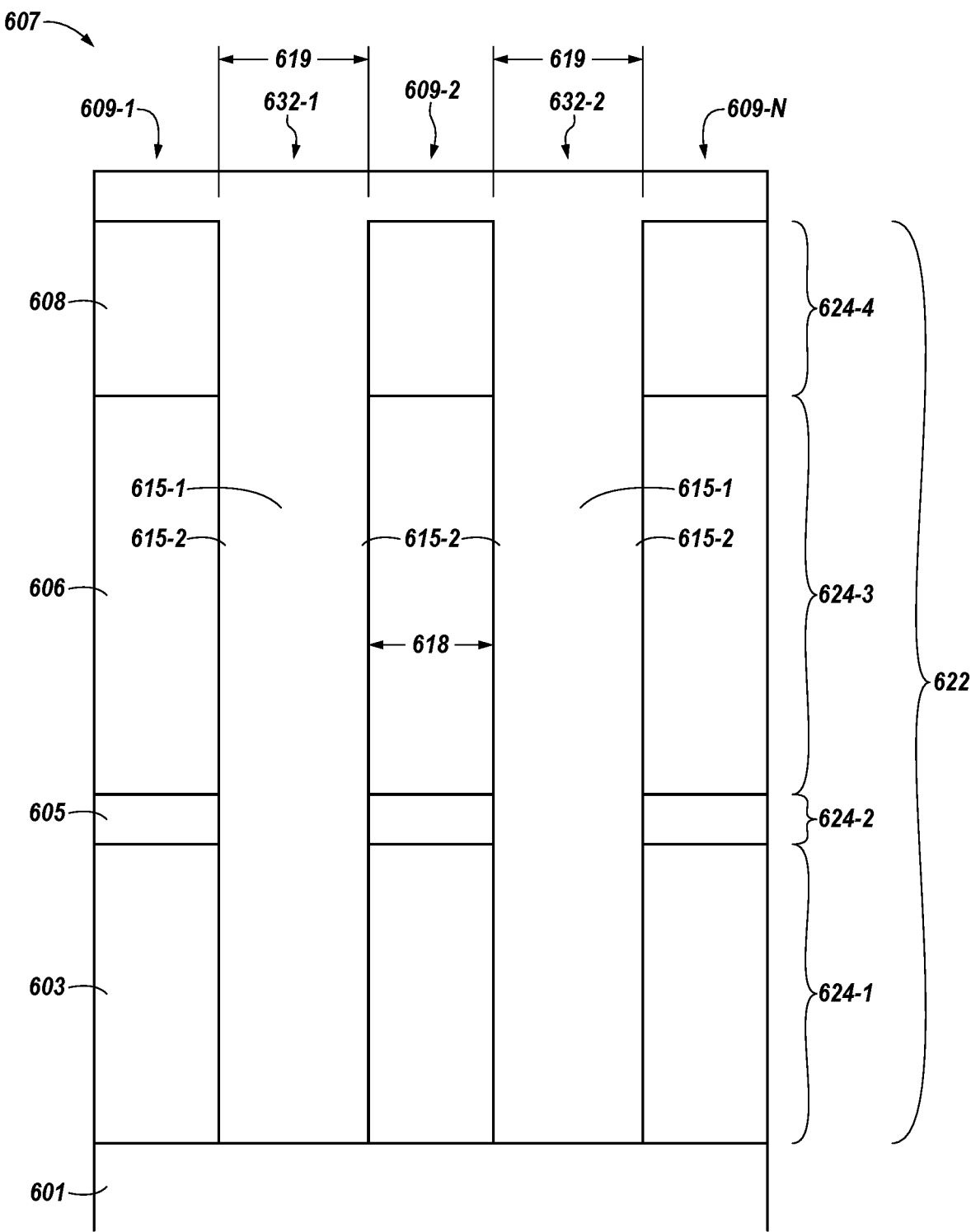

FIG. 6 illustrates a cross-sectional view 607 of a portion of an example semiconductor structure of a memory device in association with a semiconductor fabrication sequence for shaping of a storage node in accordance with a number of examples of the present disclosure. FIG. 6 illustrates the example semiconductor structure at the particular stage following completion of the example fabrication sequence described in connection with FIG. 1.

The cross-sectional view 607 can include the same or similar elements as the example cross-sectional views 100, 202, 304, 413, and 530 as referenced in FIGS. 1, 2, 3, 4, and 5 respectively. For example, the substrate material 601 is analogous or similar to substrate material 101, 201, 301, 401, and 501 of FIGS. 1, 2, 3, 4, and 5 respectively. The first silicate material 603 is analogous or similar to first silicate material 103 and 203 of FIGS. 1 and 2 respectively. The first nitride material 605 is analogous or similar to first nitride material 105, 205, 305, 405, and 505 of FIGS. 1, 2, 3, 4, and 5 respectively. The second silicate material 606 is analogous or similar to second silicate material 106 and 206 of FIGS. 1 and 2 respectively. The second nitride material 608 is analogous or similar to second nitride material 108, 208, 308, 408, and 508 of FIGS. 1, 2, 3, 4, and 5 respectively.

After the formation of the plurality of pillars 609 (as detailed in FIG. 1), the increase in the height 622 of the plurality of pillars 609 may cause a bending and/or leaning of the plurality of pillars 609 due to a tapering of the plurality of pillars 609. The tapering may be removed using a wet etch process. The removal of the tapering may result in straighter plurality of pillars 609.

After the completion of the formation of the plurality of pillars 209, a storage node material 615 may be deposited within the openings 632. That is, the storage node material 615 may completely fill the openings 632. The storage node material 615 may fill the openings 632 from the top of the substrate material 601 to the top of the second nitride material 608. The storage node material 615 may cover the top of the plurality of pillars 609. That is, the storage node material 615 may cover the width 619 of the openings 632. The storage node material 615 may be the total height 622 of the plurality of pillars 609.

The storage node material 615 may be used to store a charge after the dielectric has filled into the openings. The storage node material 615 may be a sacrificial liner formed out of a high recess rate bottom electrode. In one example, the bottom electrode may be formed from a nitride material. The storage node material 615 may include two layers 615-1 and 615-2 and each may be a separate layer of storage node material and/or may be composed of different material. The first storage node material 615-1 may be a formed from a nitride material. In one example, the nitride material may be a titanium nitride (TiN) material. The second storage node material 615-2 may include a plurality of dopants. To control the etch rate of the TiN, the second storage node material 615-2 may be doped with silicon (TiSiN). The second storage node material 615-2 may be placed to selectively target which areas of the plurality of pillars 609 will be etched.

In one example, the second storage node material 615-2 may be a boron-doped titanium nitride (TiBN) material, a silicon-doped titanium nitride (TiSiN) material, an aluminum-doped titanium nitride (TiAlN) material, a carbon-doped titanium nitride (TiCN) material, a tungsten-doped titanium nitride (TiWN) material among other possibilities. In another example, the second storage node material 615-2 may also be doped with an oxide material. The oxide material may be a ruthenium oxide (RuO) material or an Iridium oxide (IrO) material, among other possibilities. The high silicon concentration range of between 10% and 40% silicon may result in an increase of the width of the pillar 616.

During the deposition of the storage node material 615, the plurality of pillars 609 may have a width 616. That is, the plurality of pillars 609 may have a width 616 after the plurality of pillars 609 have been formed, any tapering etched, and the storage node material 615 has been deposited within the openings 632. The width of the plurality of pillars 609 may range from approximately 10 nm to 20 nm.

Figure 7:
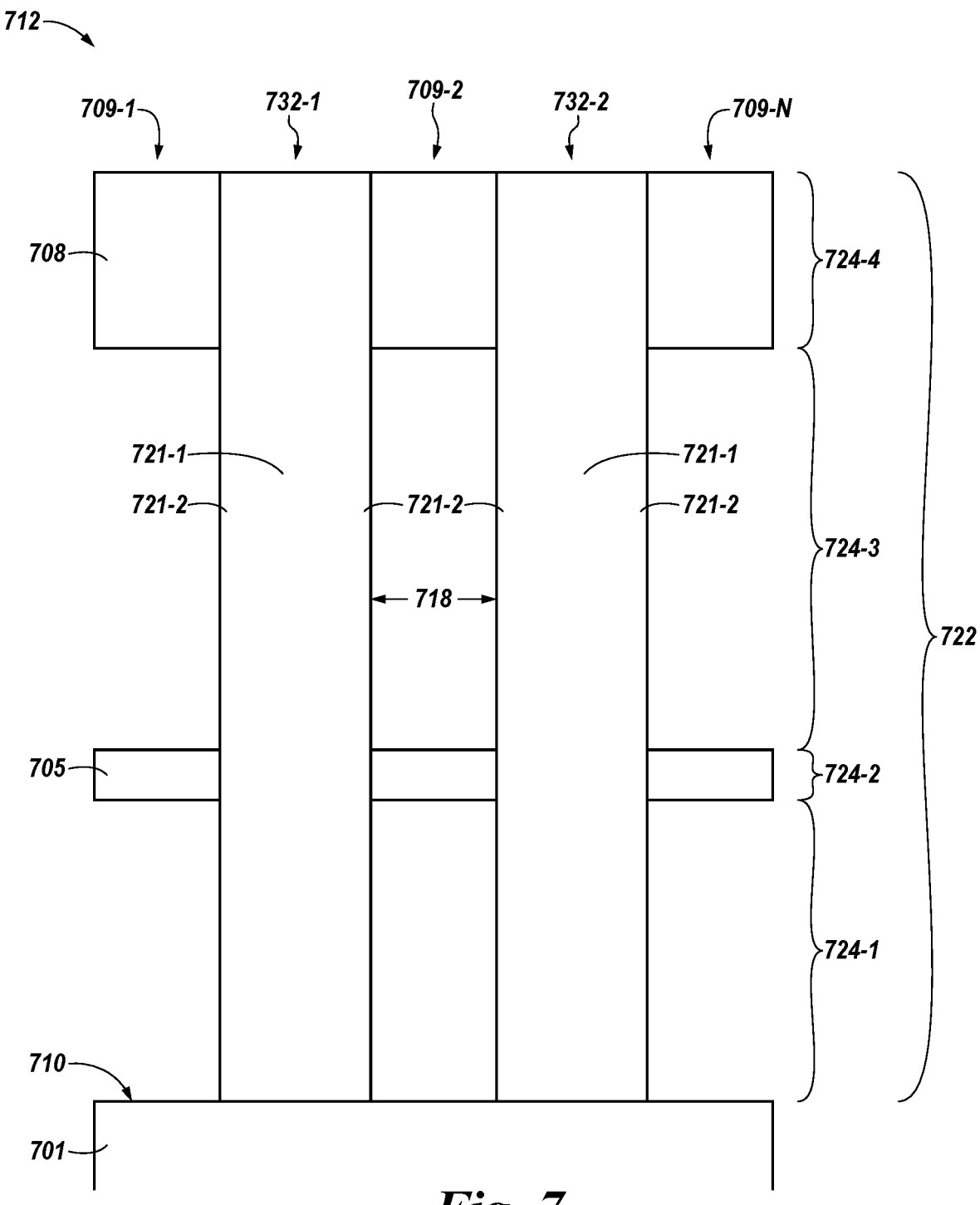

FIG. 7 illustrates a cross-sectional view 712 of a portion of an example semiconductor structure of a memory device in association with a semiconductor fabrication sequence for shaping of a storage node in accordance with a number of examples of the present disclosure. FIG. 7 illustrates the example semiconductor structure at the particular stage following completion of the example fabrication sequence described in connection with FIG. 6.

The cross-sectional view 712 can include the same or similar elements as the example cross-sectional views 100, 202, 304, 413, 530, and 607 as referenced in FIGS. 1, 2, 3, 4, 5, and 6 respectively. For example, the substrate material 701 is analogous or similar to substrate material 101, 201, 301, and 401, 501 and 601 of FIGS. 1, 2, 3, 4, 5, and 6 respectively. The first nitride material 705 is analogous or similar to first nitride material 105, 205, 305, 405, 505, and 605 of FIGS. 1, 2, 3, 4, 5, and 6 respectively. The second nitride material 708 is analogous or similar to second nitride material 108, 208, 308, 408, 508, and 608 of FIGS. 1, 2, 3, 4, 5, and 6.

In this example, the first silicate material shown at 103, 203, and 603 in FIGS. 1, 2, and 6, respectively and the second silicate material shown at 106, 206, and 606 in FIGS. 1, 2, and 6, respectively have been etched and recessed from the plurality of pillars 709. The first and second silicate materials may be removed with (via application of) a solvent that is selective for removing (e.g., dissolving) the first and second silicate materials from plurality of pillars 709 while not removing (e.g., leaving) other materials such that the nitride lattice materials that remain on the plurality of pillars 709. Such a selective solvent may be selected from water ($H_2O$), methanol ($CH_3OH$), ethanol ($C_2H_5OH$), isomers of propanol ($C_3H_7OH$) such as n-propanol and isopropanol, n-butanol ($C_4H_9OH$), among other possible alcohols, and sulfuric acid ($H_2SO_4$), Hydrofluoric acid (HF), Phosphoric Acid ($H_3PO_4$), Hydrochloric Acid (HCl), Ammonium Hydroxide ($NH_4OH$), and combinations thereof, among other possibilities. Removal of the first and second silicate materials may leave empty spaces (e.g., voids) in the semiconductor structure of the memory device during the fabrication process.

The first nitride material 705 and the second nitride material 708 may be left remaining following the application of the selective solvent, among other possible components or structural features that may remain in the structure of the memory device. The first nitride material 705 and the second nitride material 708 may function as a capacitor support structure, to provide support in view of the voids in the semiconductor structure during the fabrication process.

Following the recessing of the first and second silicate materials within the plurality of pillars 709, the storage node material (shown as 615 in FIG. 6) may be recessed from within the plurality of pillars 709. That is, the bottom electrode of the storage node material 721 may be recessed from within the plurality of pillars 709 towards the openings 732. The storage node material 721 is a recessed version of the storage node material 615 as shown in FIG. 6; the storage node material 721 has a reduced width.

The width 718 of the plurality of pillars 709 may range from approximately 10 nm to 20 nm. That is, the plurality of pillars 709 may have a width increase ranging from 0.2 nm to 5 nm after the storage node material 721 has been recessed. The increase of the width 718 of the plurality of pillars 709 may cause the storage node material 721 to decrease in diameter.

The storage node material 721 may be recessed using a dilution containing hydrofluoride. In one example, the recess of the storage node material 721 etch may occur during the wet etch removal of the tapering of the openings 732. In another example, the recess of the storage node material 721 may occur during the wet or dry etch removal of the first and second silicate materials. In another example, the recess of the storage node material 721 may occur after the removal of the first and second silicate materials. The recess rate of the hydrofluoric acid dilution is determined by the silicon concentration of the TiSiN of the storage node material 721. The silicon concentration within the storage node material 721 determines the recess rate of the storage node material 721. That is, the silicon concentration within the storage node material 721 will determine how fast the hydrofluoric acid dilution will recess the storage node material 721.

The sequence detailed in FIGS. 4 and 5 of depositing a silicon fill material, a dielectric and a top electrode material between the plurality of pillars 709 may follow after the recess of the storage node 721.

Figure 8:
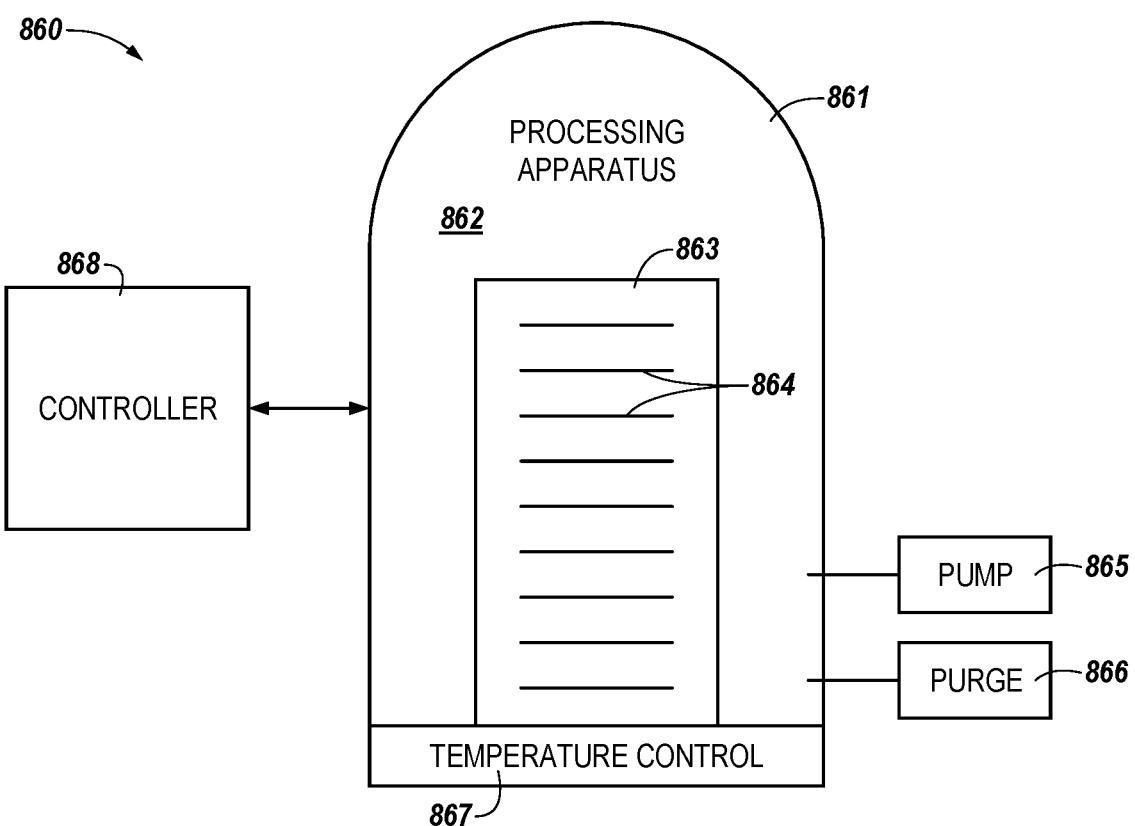
FIG. 8 is a functional block diagram of a system for implementation of an example semiconductor fabrication process in accordance with a number of embodiments of the present disclosure.

FIG. 8 is a functional block diagram of a system 860 for implementation of an example semiconductor fabrication process in accordance with a number of embodiments of the present disclosure. The system 860 can include a processing apparatus 861. The processing apparatus 861 can be configured to enable shaping a storage node material.

The processing apparatus 861 can include a semiconductor processing chamber 862 to enclose components configured to shape a storage node material. The chamber 862 can further enclose a carrier 863 to hold a batch of semiconductor wafers 864 (e.g., the substrate material 101). The processing apparatus 861 can include and/or be associated with tools including, for example, a pump 865 unit and a purge 866 unit configured to introduce and remove reactants. In one example, the reactants may include precursors/reducing agents. The processing apparatus 861 can further include a temperature control 867 unit configured to maintain the chamber 862 at appropriate temperatures as described herein.

The system 860 can further include a controller 868. The controller 868 can include, or be associated with, circuitry and/or programming for implementation of, for instance, depositing a storage node material. Adjustment of such deposition and purging operations by the controller 868 can control the thickness of the materials described herein (the first silicate material, the first nitride material, the first silicate material, and the second nitride material).

The controller 868 can, in a number of embodiments, be configured to use hardware as control circuitry. Such control circuitry may, for example, be an application specific integrated circuit (ASIC) with logic to control fabrication steps, via associated deposition and purge processes, for shaping a storage node material.

Figure 9:
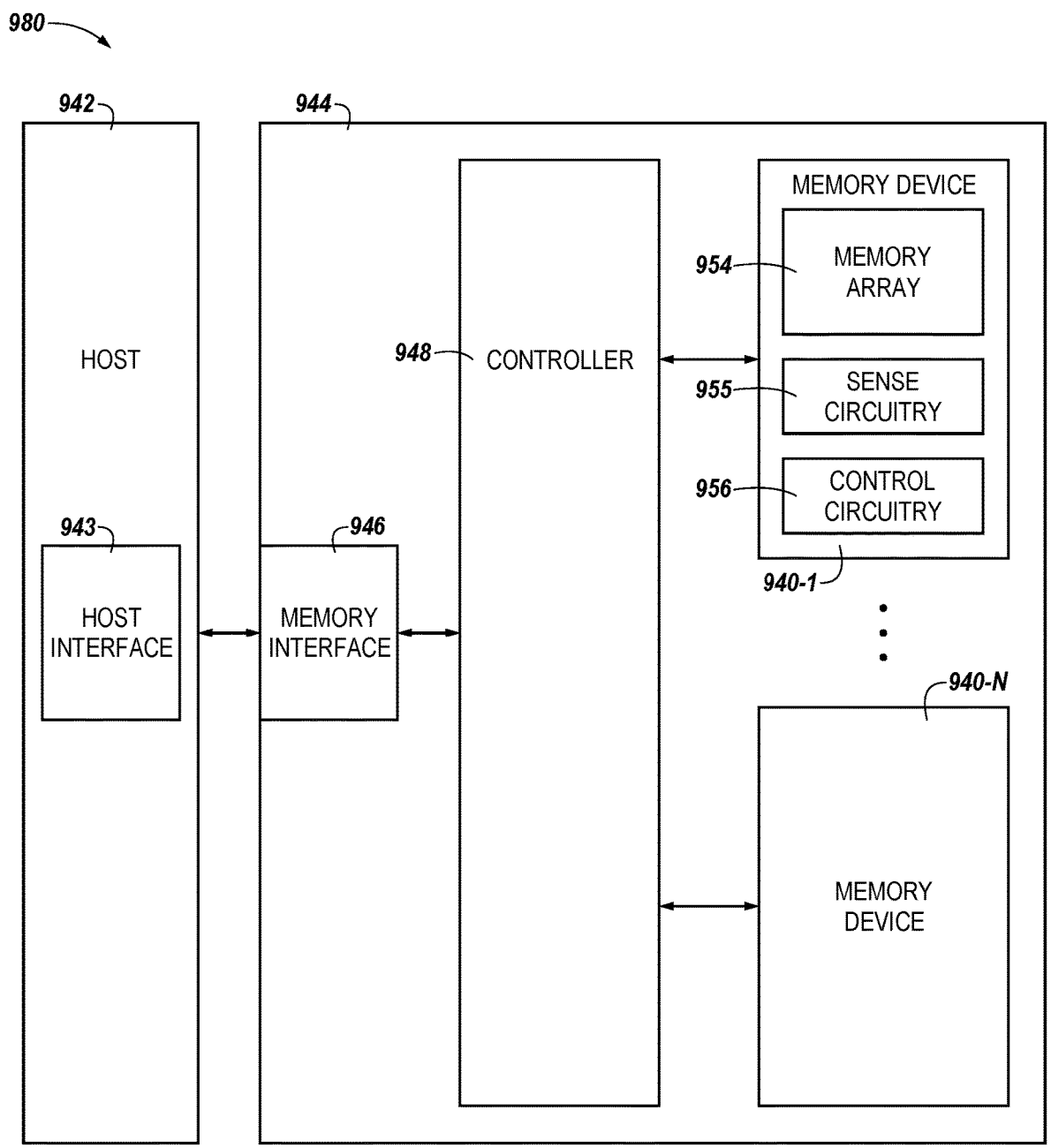
FIG. 9 illustrates a functional block diagram of a computing system including at least an example of semiconductor structure of a memory system in accordance with one or more examples of the present disclosure.

FIG. 9 is a functional block diagram of a computing system 980 including at least an example of semiconductor structure of a memory system 944 in accordance with one or more examples of the present disclosure. Memory system 944 may be, for example, a solid-state drive (SSD).

In the example illustrated in FIG. 9, memory system 944 includes a memory interface 946, a number of memory devices 940-1, . . . , 940-N, and a controller 948 selectably coupled to the memory interface 946 and memory devices 940-1, . . . , 940-N. Memory interface 946 may be used to communicate information between memory system 944 and another device, such as a host 942. Host 942 may include a processor (not shown). As used herein, "a processor" may be a number of processors, such as a parallel processing system, a number of coprocessors, etc. Example hosts may include, or be implemented in, laptop computers, personal computers, digital cameras, digital recording devices and playback devices, mobile telephones, PDAs, memory card readers, interface hubs, and the like. Such a host may be associated with fabrication operations performed on semiconductor devices and/or SSDs using, for example, a processing.

In a number of examples, host 942 may be associated with (e.g., include or be coupled to) a host interface 943. The host interface 943 may enable input of scaled preferences (e.g., in numerically and/or structurally defined gradients) to define, for example, critical dimensions (CDs) of a final structure or intermediary structures of a memory device (e.g., as shown at 940) and/or an array of memory cells (e.g., as shown at 954) formed thereon to be implemented by the processing apparatus. The scaled preferences may be provided to the host interface 943 via input of a number of preferences stored by the host 942, input of preferences from another storage system (not shown), and/or input of preferences by a user (e.g., a human operator).

Memory interface 946 may be in the form of a standardized physical interface. For example, when memory system 944 is used for information (e.g., data) storage in computing system 980, memory interface 946 may be a serial advanced technology attachment (SATA) interface, a peripheral component interconnect express (PCIe) interface, or a universal serial bus (USB) interface, among other physical connectors and/or interfaces. In general, however, memory interface may provide an interface for passing control, address, information, scaled preferences, and/or other signals between the controller 948 of memory system 944 and a host 942 (e.g., via host interface 943).

Controller 948 may include, for example, firmware and/or control circuitry (e.g., hardware). Controller 948 may be operably coupled to and/or included on the same physical device (e.g., a die) as one or more of the memory devices 940-1, . . . , 940-N. For example, controller 948 may be, or may include, an ASIC as hardware operably coupled to circuitry (e.g., a printed circuit board) including memory interface 946 and memory devices 940-1, . . . , 940-N. Alternatively, controller 948 may be included on a separate physical device that is communicatively coupled to the physical device (e.g., the die) that includes one or more of the memory devices 940-1, . . . , 940-N.

Controller 948 may communicate with memory devices 940-1, . . . , 940-N to direct operations to sense (e.g., read), program (e.g., write), and/or erase information, among other functions and/or operations for management of memory cells. Controller 948 may have circuitry that may include a number of integrated circuits and/or discrete components. In a number of examples, the circuitry in controller 948 may include control circuitry for controlling access across memory devices 940-1, . . . , 940-N and/or circuitry for providing a translation layer between host 942 and memory system 944.

Memory devices 940-1, . . . , 940-N may include, for example, a number of memory arrays 954 (e.g., arrays of volatile and/or non-volatile memory cells). For instance, memory devices 940-1, . . . , 940-N may include arrays of memory cells, such as a portion of an example memory device 990 structured to form structures formed according to embodiments described in FIGS. 1-7, described in connection with FIG. 9. As will be appreciated, the memory cells in the memory arrays 954 of memory devices 940-1, ..., 940-N and/or as shown at 1076 may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory devices 940, 1076 may be formed on the same die. A memory device (e.g., memory device 940-1) may include one or more arrays 954 of memory cells formed on the die. A memory device may include sense circuitry 955 and control circuitry 956 associated with one or more arrays 954 formed on the die, or portions thereof. The sense circuitry 955 may be utilized to determine (sense) a particular data value (e.g., 0 or 1) that is stored at a particular memory cell in a row of an array 954. The control circuitry 956 may be utilized to direct the sense circuitry 955 to sense particular data values, in addition to directing storage, erasure, etc., of data values in response to a command from host 942 and/or host interface 943. The command may be sent directly to the control circuitry 956 via the memory interface 946 or to the control circuitry 956 via the controller 948.

The example illustrated in FIG. 9 may include additional circuitry that is not illustrated so as not to obscure examples of the present disclosure. For example, memory devices 940, 1076 may include address circuitry to latch address signals provided over I/O connectors through I/O circuitry. Address signals may be received and decoded by a row decoder and a column decoder to access a memory array 954. It will be appreciated that the number of address input connectors may depend on the density and/or architecture of memory devices 940, 1076 and/or memory arrays 954.

Figure 10:
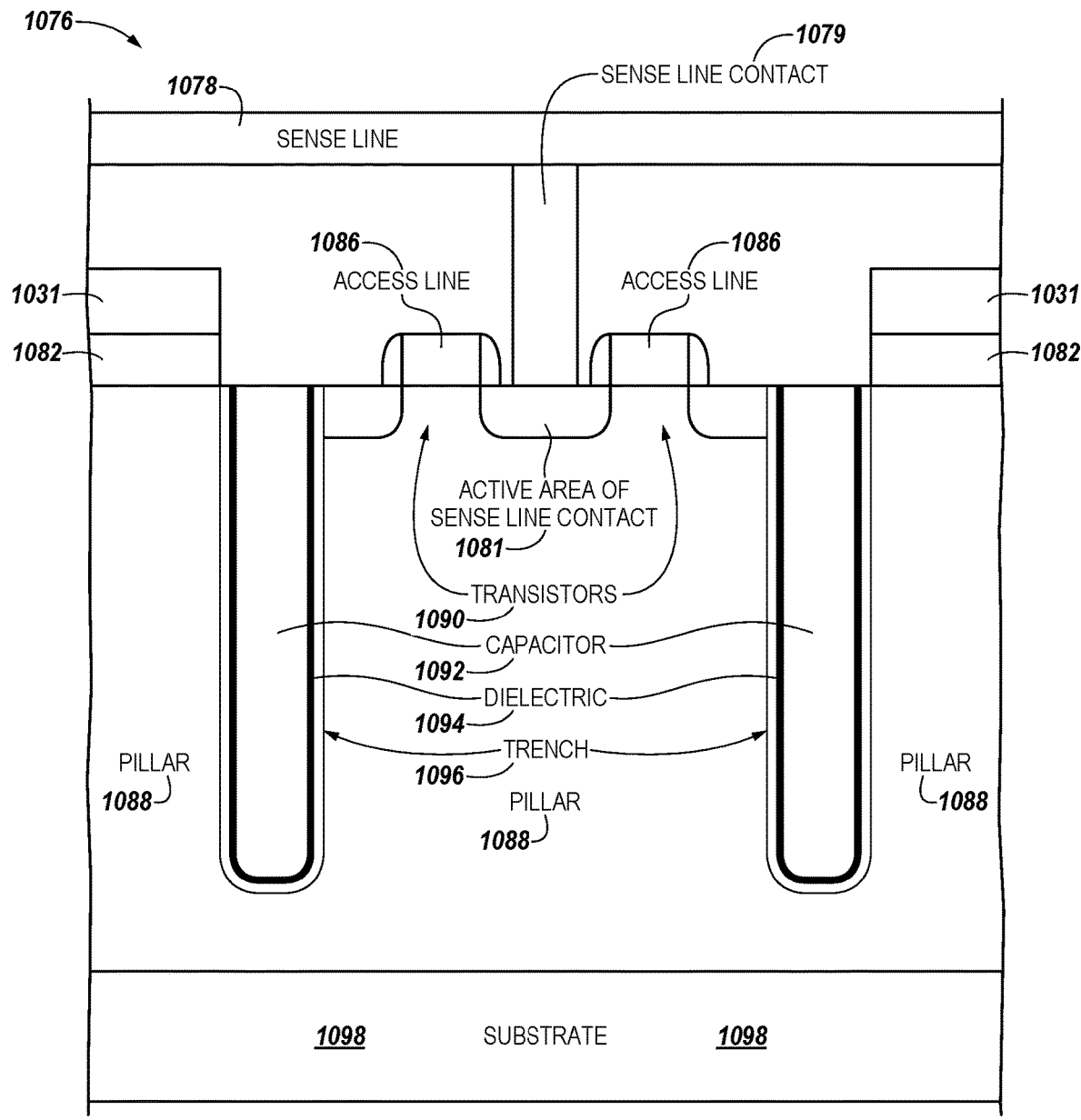
FIG. 10 illustrates a cross-sectional view of a portion of an example of semiconductor structure of a memory device that include a structure formed in accordance with a number of examples of the present disclosure.

FIG. 10 illustrates a cross-sectional view of a portion of an example of semiconductor structures of a memory device 1076 that include a structure formed in accordance with a number of embodiments of the present disclosure. The portion of the memory device 1076 illustrated in FIG. 10 is shown by way of example and not by way of limitation to include a DRAM memory cell architecture. Another RAM, flash (e.g., NAND or NOR), and/or 3D memory cell architecture also may include pillars and adjacent trenches. Embodiments are not so limited. Although the DRAM transistors 1090 and silicon fill materials 1092 are shown to be arranged in a lateral configuration, embodiments may include the transistors 1090 and silicon fill materials 1092 being arranged in a lateral, a vertical, or any other configuration.

The portion of the memory device 1076 shown in FIG. 10 may represent two DRAM memory cells in a 1T1C (one transistor one capacitor) configuration or one DRAM memory cell in a 2T2C configuration. DRAM memory cells may utilize capacitors 1092 each formed in a trench 1096 to store a particular charge corresponding to a data value. Forming the trenches 1096 as shown in FIG. 10 may result in a pillar 1088 being formed from the etched material on each side of a trench 1096. Pillars 1088 may be formed (e.g., fabricated) as layers of doped or undoped semiconductor material deposited on a substrate material 1098. The semiconductor material may be etched to form the pillars 1088 and trenches 1096. In some embodiments, an opening (e.g., a round, square, oblong, etc., opening rather than a rectilinear trench) may be etched into the semiconductor material and capacitor material may be deposited in the openings, although such a configuration does not affect the concept of passivation material for pillars adjacent a trench described herein.

Moreover, embodiments of the present disclosure are not limited to capacitors being formed in a trench for data storage, nor are embodiments limited to the trench containing capacitor material. For example, various types of memory devices may include trenches between sidewall structures (e.g., pillars) in which various materials may be positioned to contribute to data access, storage, and/or processing or in which various materials may be formed for electrical conduction and/or isolation (e.g., conductor, resistor, and/or dielectric materials), among other functions and/or operations.

In a number of embodiments, a trench 1096 may be etched to a particular depth into a pillar material. The trench 1096 may be etched into the material of the pillars 1088 to a depth approaching the substrate material 1098, as shown in FIG. 10. Alternatively, the trench 1096 may be etched into the material of the pillars 1088 to a top of or into the substrate material 1098. The depth of the trench 1096 approaching, at the top of, and/or into the substrate material 1098 is termed herein as being in the bottom region of the trench.

As described herein, increasing the space between adjacent capacitor material that may be deposited within the openings between the support pillars, formed according to embodiments described in FIGS. 1-7, may reduce the diameter of a capacitor 1092. In one example, increasing the surface area of the trench boundaries may increase a capacitance of the capacitor 1092 formed in the trench 1096 (e.g., by increasing a volume and/or surface area of the capacitor). In this example, the trench 1096 may be lined with a dielectric material 1094 and a capacitor material may be formed (e.g., deposited) within the trench 1096 and on the dielectric material 1094 to form the capacitor 1092 to a particular (e.g., target) depth.

Each pillar 1088 of the pillar material may extend to a particular height above the substrate material 1098. As such, each pillar 1088 has a top surface at the particular height. A number of structural materials may be formed on or in association with the top surface of the pillar 1088 adjacent the trench 1096. For example, a particular material 1082 may be formed to contribute to data access, storage, and/or processing (e.g., conductor, resistor, and/or dielectric materials). Such a material 1082 may be formed on the top surface of the pillar 1088 adjacent the trench 1096. A mask material 1031 may be formed to protect an underlying material 1082 and/or the top surface of the pillar 1088 adjacent the trench 1096 from subsequent processing and/or wear encountered in use of the memory device 1076. Other structural materials that may be formed (e.g., in a DRAM configuration as shown in FIG. 10) on or in association with the top surface of the pillar 1088 adjacent the trench 1096. The other structural materials may include the transistors 1090, access lines 1086, and/or sense lines 1078, among other possible structural materials. The structural materials just described as being formed on and/or in association with the top surface of the pillar 1088 adjacent the trench 1096 are termed herein as being in a top region of the pillar 1088 and/or trench 1096.

In the above detailed description of the present disclosure, reference is made to the accompanying drawings that form a part hereof, and in which is shown by way of illustration how one or more examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of the present disclosure.

It is to be understood that the terminology used herein is for the purpose of describing particular examples only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example examples including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches, among other materials and/or components related to shaping a storage node material have been illustrated and described herein, examples of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, sidewalls of openings and/or trenches related to shaping a storage node than those disclosed herein are expressly included within the scope of this disclosure.

Although specific examples have been illustrated and described herein, those of ordinary skill in the art will appreciate that an arrangement calculated to achieve the same results may be substituted for the specific examples shown. This disclosure is intended to cover adaptations or variations of one or more examples of the present disclosure. It is to be understood that the above description has been made in an illustrative fashion, and not a restrictive one. Combination of the above examples, and other examples not specifically described herein will be apparent to those of skill in the art upon reviewing the above description. The scope of the one or more examples of the present disclosure includes other applications in which the above structures and processes are used. Therefore, the scope of one or more examples of the present disclosure should be determined with reference to the appended claims, along with the full range of equivalents to which such claims are entitled.

In the foregoing Detailed Description, some features are grouped together in an example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a disclosed example. Thus, the following claims are hereby incorporated into the Detailed Description, with each claim standing on its own as a separate example.

What is claimed is:

1. A method to shape a storage node material, comprising:
    forming a pillar with a pattern of materials comprising sacrificial materials;
    depositing a storage node material on a side of the pillar;
    etching the sacrificial materials within the pillar; and
    selectively etching the storage node material in a direction from the pillar into a center of the storage node material.

2. The method of claim 1, wherein etching the storage node material comprises etching a sacrificial liner portion of the storage node material.

3. The method of claim 1, further comprising etching the storage node material using a hydrofluoric acid.

4. The method of claim 1, further comprising etching the storage node material, wherein the storage node material comprises of two materials.

5. The method of claim 4, further comprising depositing a bottom electrode, wherein the bottom electrode comprises a first material formed from titanium nitride (TiN) material.

6. The method of claim 1, wherein depositing the storage node material comprises depositing a bottom electrode.

7. The method of claim 6, wherein depositing the bottom electrode comprises depositing a nitride material.

8. The method of claim 1, further comprising depositing a dielectric fill over the storage node material.

9. A method to shape a storage node, comprising:
    depositing a pattern of materials comprising sacrificial materials;
    forming an opening in the pattern of materials;
    depositing a storage node material within the opening;
    recessing the sacrificial materials within the pillars; and
    selectively recessing the storage node material in a direction from the pillars into the storage node.

10. The method of claim 9, further comprising forming the pattern of materials from sacrificial oxide materials separated by nitride lattices.

11. The method of claim 9, wherein depositing the storage node material comprises depositing an oxide material.

12. The method of claim 11, wherein depositing the storage node material comprises depositing a ruthenium oxide (RuO) material.

13. The method of claim 9, further comprising increasing a width of the pillars by a range between 0.2-5 nanometers (nm).

14. The method of claim 9, wherein depositing the storage node material comprises depositing a first material formed from boron doped titanium nitride (TiBN) material.

15. A method to shape a storage node, comprising:
    depositing a pattern of materials comprising sacrificial materials;
    forming an opening in the pattern of materials;
    etching sides of the pillars to remove a tapering of the opening;
    depositing a titanium nitride (TiN) material on the sides of the pillars;
    depositing a titanium silicon nitride (TiSiN) material on the sides of the pillars;
    etching the sacrificial materials within the pillars;
    etching the TiN in a direction from the opening into the storage node;
    etching the TiN in a direction from the pillars into the storage node; and
    depositing a dielectric fill over the etched TiN; and
    depositing a top electrode over the dielectric fill.

16. The method of claim 15, further comprising depositing the TiSiN material to etch away a diameter of the pillars.

17. The method of claim 16, further comprising reducing a diameter of the opening by a range between 2-40 angstroms.

18. The method of claim 16, further comprising doping the TiSiN material to have a silicon concentration of a range between 10 to 40%.

19. The method of claim 16, further comprising etching the TiSiN using a hydrofluoric acid solution (HF).

20. The method of claim 18, wherein depositing the TiSiN comprises varying silicon within the TiSiN material by controlling an etch rate of the TiSiN.

\* \* \* \* \*